United States Patent
Cai et al.

(10) Patent No.: US 10,222,404 B2
(45) Date of Patent: Mar. 5, 2019

(54) GENERAL LOAD FLOW CALCULATION METHOD FOR POWER SYSTEMS WITH UNIFIED POWER FLOW CONTROLLER

(71) Applicant: State Grid JiangSu Economic Research Institute, Nanjing (CN)

(72) Inventors: Hui Cai, Nanjing (CN); Zhenjian Xie, Nanjing (CN); Zheng Xu, Nanjing (CN); Jian Yang, Nanjing (CN); Wanchun Qi, Nanjing (CN); Wenjia Zhang, Nanjing (CN); Chen Li, Nanjing (CN); Quanquan Wang, Nanjing (CN); Chen Wu, Nanjing (CN)

(73) Assignee: STATE GRID JIANGSU ECONOMIC RESEARCH INSTITUTE, Nanjing (CN)

(*) Notice: Subject to any disclaimer, the term of this patent is extended or adjusted under 35 U.S.C. 154(b) by 0 days.

(21) Appl. No.: 15/740,015

(22) PCT Filed: Jun. 30, 2017

(86) PCT No.: PCT/CN2017/091020
§ 371 (c)(1),
(2) Date: Dec. 27, 2017

(87) PCT Pub. No.: WO2018/103317
PCT Pub. Date: Jun. 14, 2018

(65) Prior Publication Data
US 2019/0004097 A1 Jan. 3, 2019

(30) Foreign Application Priority Data

Dec. 9, 2016 (CN) .......................... 2016 1 1129584

(51) Int. Cl.
*G01R 21/133* (2006.01)
*H02J 3/18* (2006.01)
*G06F 17/16* (2006.01)

(52) U.S. Cl.
CPC ........ *G01R 21/1331* (2013.01); *H02J 3/1814* (2013.01); *G06F 17/16* (2013.01)

(58) Field of Classification Search
CPC ..... G01R 21/1331; H02J 3/1814; G06F 17/16
See application file for complete search history.

(56) References Cited

U.S. PATENT DOCUMENTS

| | | | | |
|---|---|---|---|---|
| 2005/0071050 | A1* | 3/2005 | Chow | ........................ G05F 1/70 700/286 |
| 2006/0229767 | A1* | 10/2006 | Chu | ........................ H02J 3/00 700/286 |
| 2009/0182518 | A1 | 7/2009 | Chu et al. | |

FOREIGN PATENT DOCUMENTS

| CN | 105140914 A | 12/2015 |
|---|---|---|
| CN | 106549384 A | 3/2017 |

OTHER PUBLICATIONS

Acha, E. "Unified power flow controller: a critical comparison of Newton-Raphson UPFC algorithms in power flow studies", IEE Proc.-Gener. Transm. Distrib., vol. 144, No. 5, Sep. 1997.*

(Continued)

*Primary Examiner* — Yoshihisa Ishizuka
(74) *Attorney, Agent, or Firm* — Gokalp Bayramoglu (57) ABSTRACT

A general load flow calculation method for power systems with unified power flow controller (UPFC). On the premise of satisfying the control objectives of UPFC, the calculation method combines the power injection model with the Newton-Raphson algorithm to solve the load flow of the power systems by iteration. It is applicable not only to a conventional UPFC structure, but also to a novel UPFC structure wherein the series and shunt transformers of a UPFC are (Continued)

connected to different AC buses or there are more than one series branch connected to a UPFC. The present invention provides the detailed process for performing a load flow evaluation, and it shows that it is unnecessary to add new state variables when solving the load flow by this method, the dimension of the Jacobian matrix will not increase during the iteration.

3 Claims, 4 Drawing Sheets

(56) References Cited

OTHER PUBLICATIONS

Keri, A. J. F., Unified Power Flow Controller (UPFC) Modeling and Analysis., IEEE Transactions on Power Delivery, vol. 14, No. 2, Apr. 1999.*

Pengcheng Song et al, Load Flow Calculation Study for Power Systems Containing UPFC, Jiangsu Electrical Engineering, Jan. 31, 2016, No. 1, vol. 35, ISSN: 1009-0665; p. 24-27.

Xifan Wang et al, Modern Power System Analysis, Mar. 30, 2013, p. 221-225, and p. 232-238.

* cited by examiner

GENERAL LOAD FLOW CALCULATION METHOD FOR POWER SYSTEMS WITH UNIFIED POWER FLOW CONTROLLER

CROSS REFERENCE TO RELATED APPLICATIONS

This application is the national phase entry of International Application No. PCT/CN2017/091020, filed on Jun. 30, 2017, which is based upon and claims priority to Chinese Patent Application No. CN2016111295848, filed on Dec. 9, 2016, the entire contents of which are incorporated herein by reference.

TECHNICAL FIELD

The present invention relates to the field of flexible power transmission & distribution technology for power systems, and particularly to a general load flow calculation method for power systems with unified power flow controller (UPFC).

BACKGROUND OF THE INVENTION

China's power grid has become more and more complex. It has developed into an expansive, complicated system with various types of power sources and loads, and power transmission and transformation equipment having different voltage levels. In recent years, with the increasing requirements of environmental protection and resource conservation, the investment and cost for expanding the scale of the power grids and adding new transmission lines has become high. Therefore, how to make full use of existing power generation resources and power transmission and transformation lines has become an increasingly important issue of the power grid.

The flexible alternating current transmission system (FACTS) technology can greatly improve the power transmission capacity and the controllability of load flow and voltage without changing the structure of the power grid, thereby providing an effective solution to the difficulties existing in the operation and development of the power grid. The unified power flow controller (UPFC), considered to be the most powerful flexible power transmission device, can separately adjust the active and reactive power and node voltage of the lines, simultaneously, can execute the function of load flow control and increase the power transmission limit of the sections, and provides voltage support, thus having a wide application.

Currently, most of the research on UPFC are based on traditional UPFC topology. However, a UPFC device with a new topology has appeared in practice. Taking Chinese UPFC demonstration project, i.e. the West Network of Nanjing, which commenced operation in the year of 2015, as an example, the topology of its UPFC device is different from that of the traditional UPFC. Specifically, it includes three modular multilevel converters. A shunt converter is connected to the 35 kV bus of a 220 kV Yanziji main transformer, and the other two series converters are respectively connected to two parallel running 220 kV lines between the Tiebei station and the Xiaozhuang station through the series transformer. The UPFC with new topology structure reduces the size and cost of the shunt converter and improves the control of section load flow while the reactive power demands of the system is still satisfied.

The calculation of the load flow for power systems with the similar new UPFC topology is an essential part of pertinent engineering design. However, the existing load flow calculation methods seldom take this UPFC topology into consideration, thus there are still some difficulties in calculating such systems.

SUMMARY OF THE INVENTION

The present invention provides a general load flow calculation method for power systems with unified power flow controller (UPFC). On the premise of satisfying the control objectives of UPFC, the calculation method combines the power injection model with the Newton-Raphson algorithm to solve the load flow of the power systems by iteration. The calculation method is applicable not only to a UPFC with conventional structure, but also to a novel UPFC structure wherein the series and shunt transformers of a UPFC are connected to different AC buses or there are more than one series branch connected to a UPFC.

A general load flow calculation method for power systems with unified power flow controller (UPFC) includes the following steps:

first, replacing the UPFC by an equivalent power injection model; subsequently, correcting a node power balance equation and a Jacobian matrix according to the equivalent power injection model of the UPFC; finally, calculating a load flow distribution of the power system with the UPFC using the Newton-Raphson algorithm by an iteration according to the corrected node power balance equation and the corrected Jacobian matrix.

Regarding, the UPFC with a new topology structure, the detailed processes of the replacement of the UPFC using the equivalent power injection model are as follows:

(1) replacing a shunt converter of the UPFC equivalent to a voltage solace E, and connecting the voltage source E to au equivalent reactance of a shunt transformer in series, then connecting to an alternating current (AC) bus n at a shunt side;

(2) replacing a series transformer of the UPFC by an equivalent voltage source B, connecting one end of the voltage source B to an AC bus l at a series side, and replacing the AC transmission line between the other end of the voltage source B and the other AC bus in at the series side by a π-type equivalent circuit consisting of an impedance and two admittances;

(3) setting up a control objective of the load flow of the UPFC, replacing the series side of the UPFC by an equivalent power injection of the AC buses at two ends of the series side of the UPFC, wherein, an active injection power $P_{ml}$ and a reactive injection power $Q_{ml}$ of the AC bus m considered as a control end of the load flow are the control objectives of the load flow of the UPFC, and an active injection power $P_{lm}$ and a reactive injection power $Q_{lm}$ of the AC bus l at the other end are calculated according to corresponding circuit parameters;

(4) calculating an active power $P_{sm}$ injected to a series connection node S of the voltage source B and the π-type equivalent circuit by the UPFC according to circuit parameters at the series side of the UPFC, and replacing the shunt side of the UPFC by an equivalent power injection of the AC bus n connected to the shunt side of the UPFC; since the UPFC does not consume the active power and due to the power balance, the active injection power of the AC bus n is $P_{no}=P_{sm}-P_{lm}$, and since a voltage amplitude of the AC bus n is controlled by a UPFC, the reactive injection power $Q_{no}$ is not considered in an iteration calculation of the load flow.

Regarding the UPFC with traditional topology structure, the detailed processes of the replacement of the UPFC using the equivalent power injection model are as follows:

first, replacing a series transformer of the UPFC by an equivalent voltage source B, connecting one end of the voltage source B to an AC bus 1 at a series side, and replacing an AC transmission line between the other end of the voltage source B and the other AC bus m at the series side by a π-type equivalent circuit consisting of an impedance and two admittances, subsequently, setting up a control objective of the load flow of the UPFC, and calculating an active power $P_{sm}$ injected to a series connection node S of the voltage source B and the π-type equivalent circuit by the UPFC, according to circuit parameters of the series side of the UPFC;

finally, replacing the whole UPFC by the equivalent power injection of the AC buses at two ends of the UPFC; wherein, an active injection power $P_{ml}$ and a reactive injection power $Q_{ml}$ of the AC bus m considered as a control end of the load flow are the control objectives of the load flow of the UPFC, the active injection power of the other AC bus 1 is $P_{lm}=P_{sm}$, and since a voltage amplitude of the AC bus 1 is controlled by the UPFC, the reactive injection power $Q_{lm}$ is not considered in an iteration calculation of the load flow.

The specific expression of the correction for the node power balance equation is as follows:

$$\begin{cases} P_{lo} - P_{lm} - V_l \sum_{j \in L} V_j(G_{lj}\cos\theta_{lj} + B_{lj}\sin\theta_{lj}) = 0 \\ Q_{lo} - Q_{lm} - V_l \sum_{j \in L} V_j(G_{lj}\sin\theta_{lj} - B_{lj}\cos\theta_{lj}) = 0 \\ P_{mo} - P_{ml} - V_m \sum_{j \in M} V_j(G_{mj}\cos\theta_{mj} + B_{mj}\sin\theta_{mj}) = 0 \\ Q_{mo} - Q_{ml} - V_m \sum_{j \in M} V_j(G_{mj}\sin\theta_{mj} - B_{mj}\cos\theta_{mj}) = 0 \\ P_{no} - P_{ne} - V_n \sum_{j \in N} V_j(G_{nj}\cos\theta_{nj} + B_{nj}\sin\theta_{nj}) = 0 \end{cases}$$

where, $P_{lo}$ is the active injection power of the AC bus 1 without considering the UPFC; $Q_{lo}$ is the reactive injection power of the AC bus 1 without considering the UPFC; $P_{mo}$ is the active injection power of the AC bus m without considering the UPFC, $Q_{mo}$ is the reactive injection power of the AC bus m without considering the UPFC; $P_{no}$ is the active injection power of the AC bus n without considering the UPFC; $V_l$, $V_m$ and $V_n$ represent the voltage amplitudes of the AC bus 1, m, n, respectively; $V_j$ represents the voltage amplitude of the AC bus j; L represents a set of the AC bus 1 and all other AC buses that are directly connected to the AC bus l; $\theta_{lj}$ represents a voltage phase angle difference between the AC bus 1 and the AC bus j; when j≠l, $G_{lj}$ and $B_{lj}$ respectively represent a real part and an imaginary part of a mutual admittance of the AC bus 1 and the AC bus j; when j=l, $G_{lj}$ and $B_{lj}$ respectively represent a real part and an imaginary part of a self-admittance of the AC bus 1 and the AC bus j; M represents a set of the AC bus m and all other AC buses that are directly connected to the AC bus m; $\theta_{mj}$ represents a voltage phase angle difference between the AC bus m and the AC bus j; when j≠m, $G_{mj}$ and $B_{mj}$ respectively represent a real part and an imaginary part of a mutual admittance of the AC bus m and the AC bus j; when j=m, $G_{mj}$ and $B_{mj}$ respectively represent a real part and an imaginary part of a self-admittance of the AC bus m and the AC bus j; N represents a set of the AC bus n and all other AC buses that are directly connected k the AC bus n, $\theta_{nj}$ represents a voltage phase angle difference between the AC bus n and the AC bus j; when j≠n, $G_{nj}$ and $B_{nj}$ respectively represent a real part and an imaginary part of a mutual admittance of the AC bus. n and the AC bus j; when j=n, $G_{nj}$ and $B_{nj}$ respectively represent a real part and an imaginary part of a self-admittance of the AC bus n and the AC bus j.

The detailed processes of the correction for the Jacobian matrix are as follows:

first, calculating a partial derivative matrix ΔY of the equivalent injection power of the UPFC according to the following expression:

$$\Delta Y = \begin{bmatrix} \frac{\partial P_{lm}}{\partial \theta_l} & \frac{\partial P_{lm}}{\partial \theta_m} & \frac{\partial P_{lm}}{\partial V_l} & \frac{\partial P_{lm}}{\partial V_m} \\ \frac{\partial Q_{lm}}{\partial \theta_l} & \frac{\partial Q_{lm}}{\partial \theta_m} & \frac{\partial Q_{lm}}{\partial V_l} & \frac{\partial Q_{lm}}{\partial V_m} \\ \frac{\partial P_{ne}}{\partial \theta_l} & \frac{\partial P_{ne}}{\partial \theta_m} & \frac{\partial P_{ne}}{\partial V_l} & \frac{\partial P_{ne}}{\partial V_m} \end{bmatrix}$$

where: $V_l$ and $V_m$ respectively represent the voltage amplitudes of the AC bus 1 and the AC bus m, $\eta_l$ and $\theta_m$ respectively represent the phase angles of the AC bus 1 and the AC bus m;

subsequently, subtracting the partial derivative matrix ΔY from the corresponding elements of the original Jacobian matrix Y to obtain the corrected Jacobian matrix.

The general load flow calculation method of the present invention does not need to add new state variables or provide the initial value of the operation state of the UPFC when the load flow for the power systems with UPFC is calculated. The dimension of the Jacobian matrix keeps the same size with that of the traditional Newton-Raphson algorithm during the iteration, so that the present invention can be easily implemented based on the existing load flow calculation program and has good convergence characteristics.

BRIEF DESCRIPTION OF THE DRAWINGS

FIG. 1(a) and FIG. 1(b) are the structural schematic diagrams of two new UPFC topologies, respectively.

DETAILED DESCRIPTION OF THE INVENTION

In order to describe the present invention concretely, the technical solutions of the present invention are described in detail with reference to the drawings and specific embodiments, hereinafter.

Figure 1:
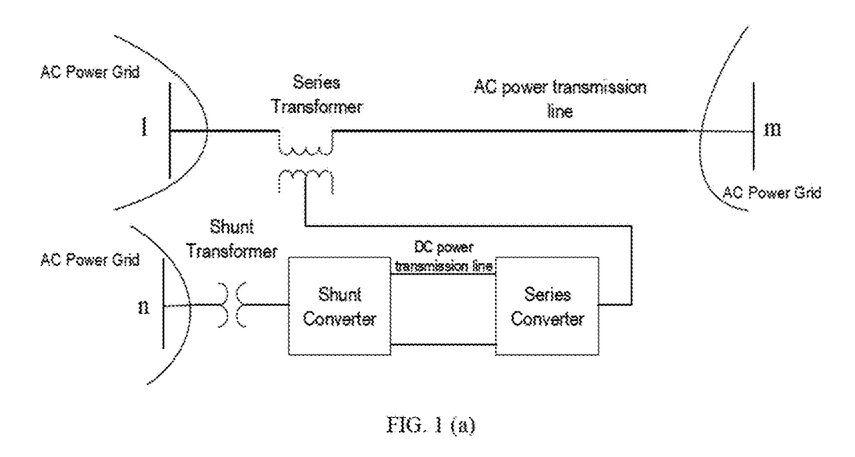
Figure 2:
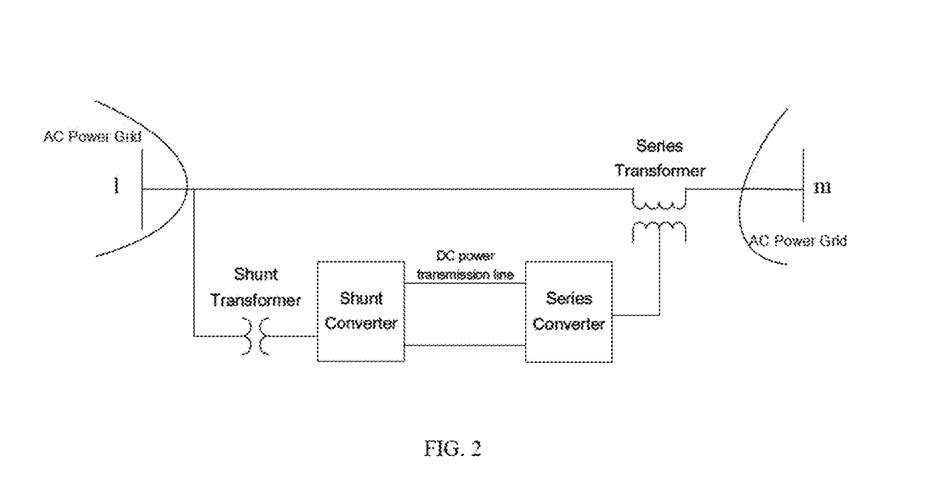
FIG. 2 is a structural schematic diagram of the traditional UPFC topology.

As shown in FIG. 1 and FIG. 2, the main difference between the traditional topology and the new topology is that the AC bus to which the shunt converter of the UPFC with the traditional topology is connected via, the shunt transformer is exactly one end of the line to which the series side of the UPFC is connected. However, the new topology does not have this limitation. FIG. 1(a) and FIG. 1(b) both show a new topology, while the main difference being that in FIG. 1(a), the UPFC only contains a series converter which is connected to one series branch, and in FIG. 1(b), there are two series converters which are connected to two series branches, respectively. The general load flow calculation method of the present invention is not only applicable to the traditional UPFC topology shown in FIG. 2, but also applicable to both cases shown in FIG. 1. In fact, the method is also applicable to a UPFC topology that includes more series converters and more series branches.

The steps of the load flow calculation for the power systems with UPFC using the present invention are described in detail hereinafter.

(1) The equivalence using power injection model.

Hereinafter, taking FIG. 1(a) as an example, the additional injection power of the nodes of the UPFC is calculated and the method by which the UPFC is considered in equivalent to the power injection model is introduced.

Figure 3:
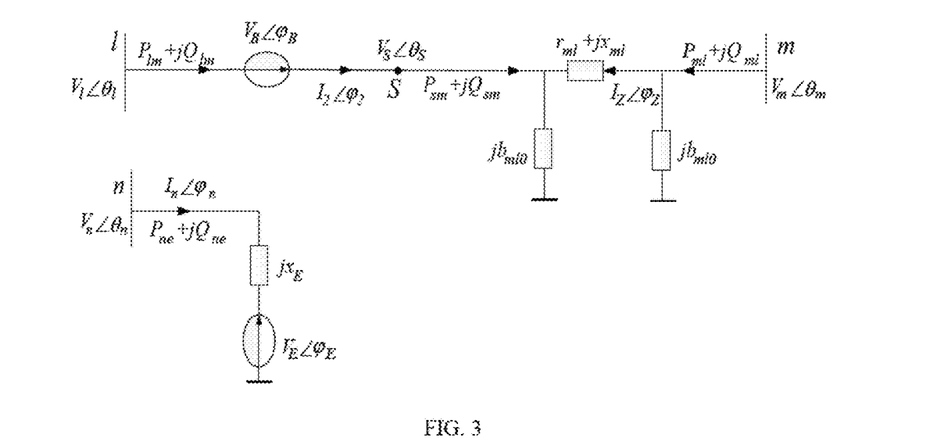
FIG. 3 is an equivalent circuit diagram of the new UPFC topology.

In the UPFC with new topology shown in FIG. 1(a), one end of the series transformer is connected to the AC bus l, the other end thereof is connected to the bus m via the AC transmission lines, and the shunt transformer is connected to the bus n. The series transformer is replaced by an equivalent voltage source $V_E \angle \varphi_E$ and the shunt converter is replaced by an equivalent voltage source $V_E \angle \varphi_E$ to obtain the equivalent circuit shown in FIG. 3. In FIG. 3, $r_{ml}+jx_{ml}$ represents the line impedance $jb_{ml0}$ represents the line-to-ground admittance, $jx_E$ represents the equivalent reactance of the shunt transformer. $P_{lm}$, $Q_{lm}$, $P_{ml}$, $Q_{ml}$, $P_{no}$ and $Q_{no}$ represent the active power and the reactive power injected from the three points of l, m, n, respectively. $P_{sm}$, $Q_{sm}$ represent the active power and the reactive power injected into the series converter, respectively $V_l \angle \theta_l$, $V_m \angle \theta_m$, $V_n \angle \theta_n$ represent the voltages of the three points of l, m, n, $V_S \angle \theta_S$ represents the voltage of point S.

When the load flow drawn from the point by the UPFC is selected to be $P_c+jQ_c$, and the voltage amplitude of the point n is selected to be $V_{set}$ ($P_c+jQ_c$ and $V_{set}$ are the controlled variables of the UPFC), the following equations are satisfied under the steady state:

$$P_{ml}=P_c \quad Q_{ml}=Q_c \quad V_n=V_{set}$$

The powers at the series side can be calculated according to the equivalent circuit:

$$P_{lm} = \frac{V_l}{V_m} \times \left( S_2 - b_{lm0} \times \left( \frac{-V_m^2 \times \sin(\theta_l - \theta_m) +}{S_1 r_{lm} + S_2 x_{lm}} \right) \right) \quad (1)$$

$$Q_{lm} = \frac{V_l}{V_m} \times \left( -S_1 + b_{lm0} \times \left( \frac{-V_m^2 \times \cos(\theta_l - \theta_m) -}{S_2 r_{lm} + S_1 x_{lm}} \right) \right) \quad (2)$$

$$P_{sm} = -P_c + \frac{(P_c^2 + Q_c^2 + 2Q_c V_m^2 b_{lm0} + V_m^4 b_{lm0}^2) r_{lm}}{V_m^2} \quad (3)$$

$$= -P_c + \frac{(S_1^2 + S_2^2) r_{lm}}{V_m^2}$$

where:

$$S_1 = Q_c \times \cos(\theta_l-\theta_m) + P_c \times \sin(\theta_l-\theta_m) + V_m^2 \times \cos(\theta_l-\theta_m)$$
$$b_{lm0}$$

$$S_2 = Q_c \times \sin(\theta_l-\theta_m) - P_c \times \cos(\theta_l-\theta_m) + V_m^2 \times \sin(\theta_l-\theta_m)$$
$$b_{lm0}$$

Since the loss of, the UPFC itself is negligible, the power balance is, as follows:

$$P_{ne}=P_{sm}-P_{lm}$$

Figure 4:
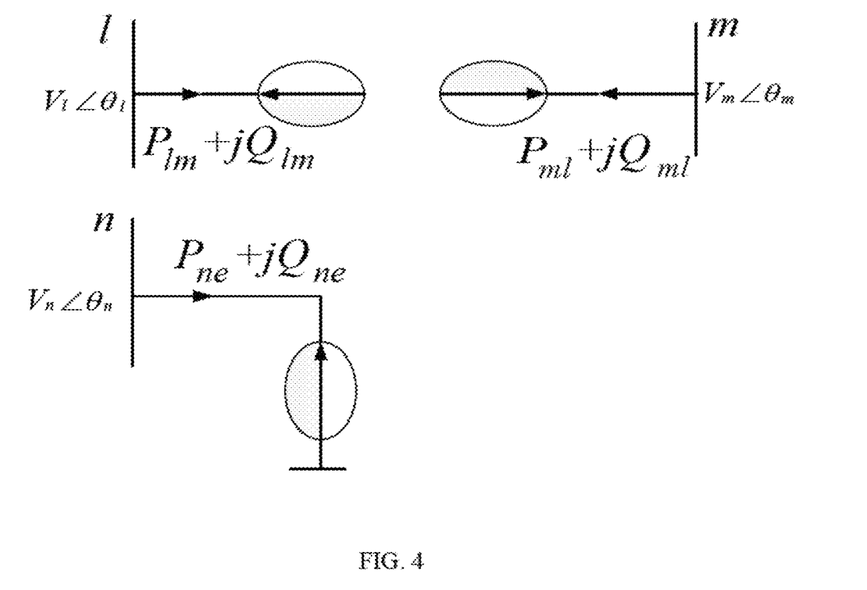
FIG. 4 is a schematic diagram of an equivalent power injection model of the new UPFC topology.

The UPFC is replaced by an equivalent injection power of the corresponding nodes to obtain the model shown in FIG. 4. Since the point n is the PV node in the load flow calculation, $Q_{ne}$ does not need to be calculated.

For the UPFC that contains more than one series branch shown in FIG. 1(b), the injection power of each series branch can be respectively calculated according formulas (1)-(3). The injection power of the shunt side can be calculated by the following formula:

$$P_{ne} = \sum_{i \in series} (P_{smi} - P_{lmi})$$

where series represents all series lines.

Figure 5:
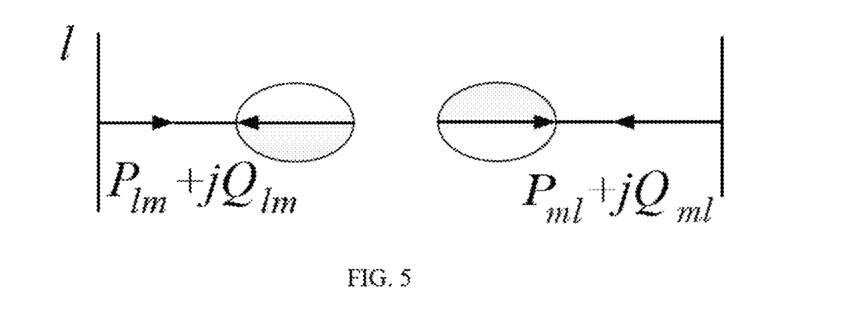
FIG. 5 is a schematic diagram of an equivalent power injection model of the traditional UPFC topology.

For the traditional UPFC topology shown in FIG. 2, the equivalent power injection model thereof is shown in FIG. 5:

$$P_{ml} = P_c \quad Q_{ml} = Q_c \quad V_l = V_{nset}$$

$$P_{lm} = -P_c + \frac{(S_1^2 + S_2^2) r_{lm}}{V_m^2}$$

(2) The correction of the power balance equation and the Jacobian matrix.

After the power injection model of the UPFC is obtained, the load flow is calculated by using the Newton-Raphson algorithm. During the calculation process, it is necessary to correct the node power balance equation and the Jacobian matrix.

The power balance equation is basically consistent of that without the UPFC, and it is only necessary to consider the equivalent power injection of the UPFC at the UPFC access nodes.

The correction of the power balance equation of the UPFC access nodes is as follows:

$$\Delta P_l = P_{lo} - P_{lm} - V_l \sum_{j \in l} V_j (G_{lj}\cos\theta_{lj} + B_{lj}\sin\theta_{lj}) = 0 \quad (4)$$

$$\Delta Q_l = Q_{lo} - Q_{lm} - V_l \sum_{j \in l} V_j (G_{lj}\sin\theta_{lj} - B_{lj}\cos\theta_{lj}) = 0$$

$$\Delta P_m = P_{mo} - P_c - V_m \sum_{j \in m} V_j (G_{mj}\cos\theta_{mj} + B_{mj}\sin\theta_{mj}) = 0 \quad (5)$$

$$\Delta Q_m = Q_{mo} - Q_c - V_m \sum_{j \in m} V_j (G_{mj}\sin\theta_{mj} - B_{mj}\cos\theta_{mj}) = 0$$

$$\Delta P_n = P_{no} - P_{ne} - V_n \sum_{j \in n} V_j (G_{nj}\cos\theta_{nj} + B_{nj}\sin\theta_{nj}) = 0 \quad (6)$$

$$\Delta Q_n = Q_{no} - Q_{ne} - V_n \sum_{j \in n} V_j (G_{nj}\sin\theta_{nj} - B_{nj}\cos\theta_{nj}) = 0$$

where: $P_{lo}$, $Q_{lo}$, $P_{mo}$, $Q_{mo}$, $P_{no}$ and $Q_{no}$ respectively represent the node injection power without considering the UPFC, $P_{lm}$, $Q_{lm}$, $P_{ml}$, $Q_{ml}$, $P_{no}$ and $Q_{no}$ respectively represent the active power and the reactive power drawn from the three points of l, m, n by the UPFC. The bus node of the load flow control end at the series side of the UPFC is calculated by formula (4), and the other end of the series side is calculated by formula (5). The bus node at the shunt side of the new topology is calculated by formula (6). Since point n is a PV node, $\Delta Q_n$ does not need to be considered in the iteration, and thus does not need to be calculated.

Since the equivalent injection power of the UPFC is relevant to the bus voltage amplitude and phase angle of its access node, it is necessary to consider the impact of this part in the Jacobian matrix, i.e., the partial derivatives of the equivalent injection power of the UPFC is subtracted from the corresponding elements in the original Jacobian matrix Y:

$$Y - \begin{bmatrix} \frac{\partial P_{lm}}{\partial \theta_l} & \frac{\partial P_{lm}}{\partial \theta_m} & \frac{\partial P_{lm}}{\partial V_l} & \frac{\partial P_{lm}}{\partial V_m} \\ \frac{\partial Q_{lm}}{\partial \theta_l} & \frac{\partial Q_{lm}}{\partial \theta_m} & \frac{\partial Q_{lm}}{\partial V_l} & \frac{\partial Q_{lm}}{\partial V_m} \\ \frac{\partial P_{ne}}{\partial \theta_l} & \frac{\partial P_{ne}}{\partial \theta_m} & \frac{\partial P_{ne}}{\partial V_l} & \frac{\partial P_{ne}}{\partial V_m} \end{bmatrix}$$

The calculation formulas of the partial derivatives are as follows:

$$\frac{\partial P_{lm}}{\partial \theta_l} = \frac{V_l}{V_m}(S_1 + b_{lm0}(C_{m1} + S_2 r_{lm} - S_1 x_{lm}))$$

$$\frac{\partial P_{lm}}{\partial \theta_m} = -\frac{\partial P_{lm}}{\partial \theta_l} \quad \frac{\partial P_{lm}}{\partial V_l} = \frac{P_{lm}}{V_l}$$

$$\frac{\partial P_{lm}}{\partial V_m} = \frac{V_l}{V_m^2}\left(-S_2 + b_{lm0}\begin{pmatrix} 3C_{m2} + (S_1 - 2C_{m1}b_{lm0})r_{lm} - \\ (-S_2 + 2C_{m2}b_{lm0})x_{lm} \end{pmatrix}\right)$$

$$\frac{\partial Q_{lm}}{\partial \theta_l} = \frac{V_l}{V_m}(S_2 - b_{lm0}(-C_{m2} + S_1 r_{lm} + S_2 x_{lm}))$$

$$\frac{\partial Q_{lm}}{\partial \theta_m} = -\frac{\partial Q_{lm}}{\partial \theta_m} \quad \frac{\partial Q_{lm}}{\partial V_l} = \frac{Q_{lm}}{V_l}$$

$$\frac{\partial Q_{lm}}{\partial V_m} = \frac{V_l}{V_m^2}\left(S_1 + b_{lm0}\begin{pmatrix} -3C_{m1} - (-S_2 + 2C_{m2}b_{lm0})r_{lm} - \\ (S_1 - 2C_{m1}b_{lm0})x_{lm} \end{pmatrix}\right)$$

$$\frac{\partial P_{ne}}{\partial \theta_l} = -\frac{\partial P_{lm}}{\partial \theta_l} \quad \frac{\partial P_{ne}}{\partial \theta_m} = -\frac{\partial P_{lm}}{\partial \theta_m} \quad \frac{\partial P_{ne}}{\partial V_l} = -\frac{\partial P_{lm}}{\partial V_l}$$

$$\frac{\partial P_{ne}}{\partial V_m} = \frac{\partial P_{sm}}{\partial V_m} - \frac{\partial P_{lm}}{\partial V_m}$$

where:

$$\frac{\partial P_{sm}}{\partial V_m} = -\frac{2r_{lm}}{V_m^3}(P_c^2 + Q_c^2 - V_m^4 b_{lm0}^2)$$

$$C_{m1} = V_m^2 \cos(\theta_l - \theta_m)$$

$$C_{m2} = V_m^2 \sin(\theta_l - \theta_m)$$

(3) Calculating the Load Flow by Iteration

Figure 6:
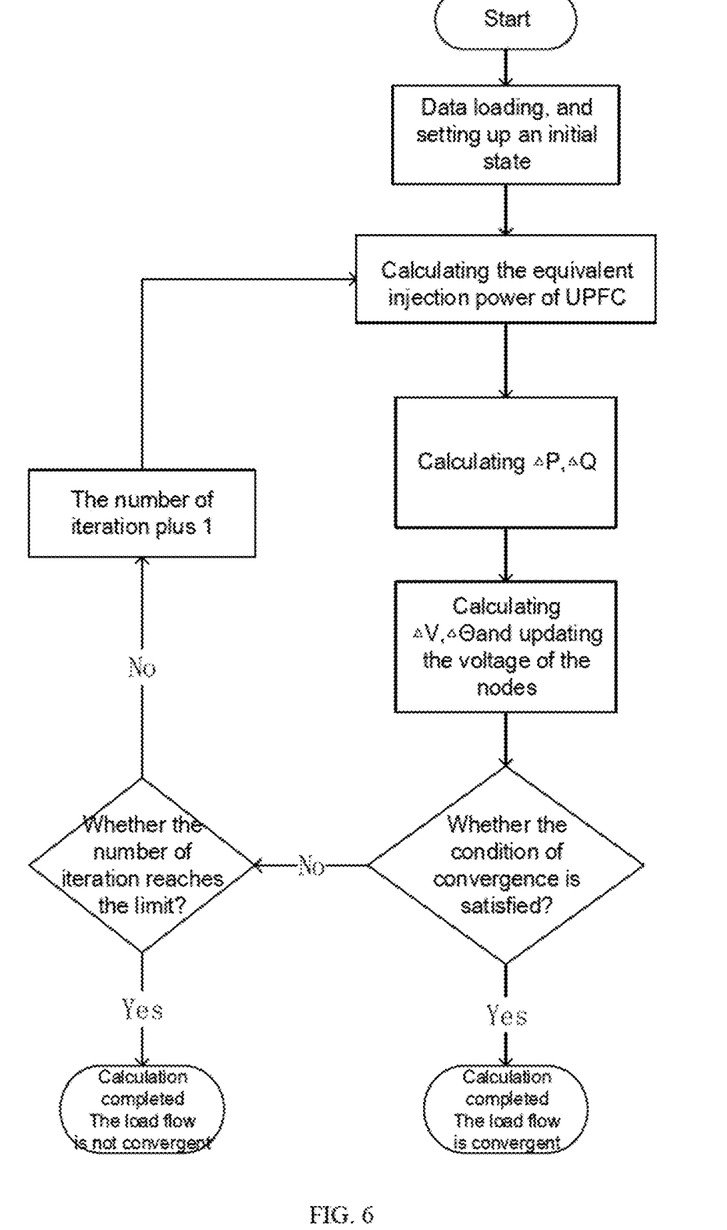
FIG. 6 is a flow chart of the load flow calculation.

The flow chart for calculating the load flow shown in FIG. 6 is described in detail as follows:

3.1 the original system data is loaded, and the initial state of the system is set;

3.2 the equivalent injection power of the UPFC is calculated according to the voltage amplitude and phase angle of the UPFC access node based on the above-mentioned method;

3.3 $\Delta P$ and $\Delta Q$ of each node are calculated according to the corrected node power balance equation;

3.4 $\Delta V$ and $\Delta \theta$ are calculated by using the corrected Jacobian matrix and the voltage amplitude and phase angle of each node are updated;

3.5 whether the convergence condition is satisfied is determined, if yes, the calculation is completed, and the load flow is convergent; otherwise, the next step is performed:

3.6 whether the number of iterations reaches the limit is determined; if yes, the calculation is completed, and the load flow is not convergent; otherwise, the number of the iterations plus 1 is established, and go back to step 3.2.

The foregoing description of the embodiments is intended to allow those of ordinary skill in the art to understand and implement the present invention. It is apparent that various modifications can be derived from the above-mentioned embodiments and the generic principles described herein can be applied to other embodiments without creative or inventive efforts by those skilled in the art. Therefore, the present invention is not limited to the above embodiments. The improvements and modifications derived from the disclosure of the present invention by those skilled in the art should be deemed within the scope of the present invention.

What is claimed is:

1. A general load flow calculation method for power systems with unified power flow controller (UPFC) comprising:

replacing the UPFC by an equivalent power injection model;

correcting a node power balance equation and a Jacobian matrix according to the equivalent power injection model of the UPFC:; and calculating a load flow distribution of the power system with the UPFC using a Newton-Raphson algorithm by an iteration according to a corrected node power balance equation and a corrected Jacobian matrix;

wherein the step of replacing the UPFC by the equivalent power injection model comprises, replacing a shunt converter of the UPFC by a first equivalent voltage source, and connecting the first voltage source to an equivalent reactance of a shunt transformer in series then connecting a first alternating current (AC) bus at a shunt side;

replacing a series transformer of the UPFC by a second equivalent voltage source, connecting one end of the second voltage source to a second AC bus at a series side, and replacing an AC transmission line between an other end of the second voltage source and a third AC bus at the series side by a π-type equivalent circuit consisting of an impedance and two admittances;

setting up a control objective of the load flow of the UPFC, replacing the series side of the UPFC by an equivalent power injection of the AC buses at two ends of the series side of the UPFC, wherein, an active injection power $P_{ml}$ and a reactive injection power $Q_{ml}$ of the third AC bus considered as a control end of the load flow are the control objectives of the load flow of the UPFC, and an active injection power $P_{lm}$ and a reactive injection power $Q_{lm}$ of the second AC bus at the other end are calculated according to a corresponding circuit parameter;

calculating an active power $P_{sm}$ injected to a series connection node S of the second voltage source and the π-type equivalent circuit by the UPFC according to a circuit parameter at the series side of the UPFC, and replacing the shunt side of the UPFC by the equivalent power injection of the first AC bus connected to the shunt side of the UPFC; wherein the UPFC does not consume the active power and due to the power balance, the active injection power of the first AC bus is $P_{ne}=P_{sm}-P_{lm}$, and a voltage amplitude of the first AC bus is controlled by the UPFC, the reactive injection power $Q_{ne}$ is not considered in an iteration calculation of the load flow.

2. The general load flow calculation method according to claim 1, wherein expression of correction of the node power balance equation is $$\begin{cases} P_{lo} - P_{lm} - V_l \sum_{j \in L} V_j(G_{lj}\cos\theta_{lj} + B_{lj}\sin\theta_{lj}) = 0 \\ Q_{lo} - Q_{lm} - V_l \sum_{j \in L} V_j(G_{lj}\sin\theta_{lj} - B_{lj}\cos\theta_{lj}) = 0 \\ P_{mo} - P_{ml} - V_m \sum_{j \in M} V_j(G_{mj}\cos\theta_{mj} + B_{mj}\sin\theta_{mj}) = 0 \\ Q_{mo} - Q_{ml} - V_m \sum_{j \in M} V_j(G_{mj}\sin\theta_{mj} - B_{mj}\cos\theta_{mj}) = 0 \\ P_{no} - P_{ne} - V_n \sum_{j \in N} V_j(G_{nj}\cos\theta_{nj} + B_{nj}\sin\theta_{nj}) = 0 \end{cases} ;$$

wherein $P_{lo}$ is the active injection power of the second AC bus without considering the UPFC; $Q_{lo}$ is the reactive injection power of the second AC bus without considering the UPFC; $P_{mo}$ is the active injection power of the third AC bus without considering the UPFC; $Q_{mo}$ is the reactive injection power of the third AC bus without considering the UPFC; $P_{no}$ is the active injection power of the first AC bus without considering the UPFC; $V_l$, $V_m$ and $V_n$ represent the voltage amplitude of the second AC bus l, the thrid AC bus m, the first AC bus n, respectively; $V_j$ represents the voltage amplitude of a fourth AC bus j; L represents a set of the second AC bus and all other AC buses that are directly connected to the second AC bus; $\theta_{lj}$ represents a voltage phase angle difference between the second AC bus l and the fourth AC bus j; when j≠l, $G_{lj}$ and $B_{lj}$ respectively represent a real part and an imaginary part of a mutual admittance of the second AC bus and the fourth AC bus j; when j=l, $G_{lj}$ and $B_{lj}$ respectively represent a real part and an imaginary part of a self-admittance of the second AC bus and the fourth AC bus j; M represents a set of the third AC bus and all other AC buses that are directly connected to the third AC bus; $\theta_{mj}$ represents a voltage phase angle difference between the third AC bus and the fourth AC bus j; when j≠m, $G_{mj}$ and $B_{mj}$ respectively represent a real part and an imaginary part of a mutual admittance of the third AC bus and the fourth AC bus j; when j=m, $G_{mj}$ and $B_{mj}$ respectively represent a real part and an imaginary part of a self-admittance of the third AC bus and the fourth AC bus j; N represents a set of the first AC bus and all other AC buses that are directly connected to the first AC bus; $\theta_{nj}$ represents a voltage phase angle difference between the first AC bus n and the fourth AC bus j; when j≠n, $G_{nj}$ and $B_{nj}$ respectively represent a real part and an imaginary part of a mutual admittance of the first AC bus and the fourth AC bus j; when j=n, $G_{nj}$ and $B_{nj}$ respectively represent a real part and an imaginary part of a self-admittance of the first AC bus n and the fourth AC bus j.

3. The general load flow calculation method according to claim 1, wherein a correction of the Jacobian matrix includes
first, calculating a partial derivative matrix ΔY of the equivalent injection power of the UPFC according to the expression $$\Delta Y = \begin{bmatrix} \frac{\partial P_{lm}}{\partial \theta_l} & \frac{\partial P_{lm}}{\partial \theta_m} & \frac{\partial P_{lm}}{\partial V_l} & \frac{\partial P_{lm}}{\partial V_m} \\ \frac{\partial Q_{lm}}{\partial \theta_l} & \frac{\partial Q_{lm}}{\partial \theta_m} & \frac{\partial Q_{lm}}{\partial V_l} & \frac{\partial Q_{lm}}{\partial V_m} \\ \frac{\partial P_{ne}}{\partial \theta_l} & \frac{\partial P_{ne}}{\partial \theta_m} & \frac{\partial P_{ne}}{\partial V_l} & \frac{\partial P_{ne}}{\partial V_m} \end{bmatrix};$$

wherein $V_l$ and $V_m$ respectively represent the voltage amplitudes of the second AC bus l and the third AC bus, $\theta_l$ and $\theta_m$ respectively represent the phase angles of the second AC bus l and the third AC bus; and
subsequently, subtracting the partial derivative matrix ΔY from the corresponding elements of the original Jacobian matrix Y to obtain the corrected Jacobian matrix.

* * * * *